(12) United States Patent
Kim et al.

(10) Patent No.: US 7,535,049 B2
(45) Date of Patent: May 19, 2009

(54) MULTI BITS FLASH MEMORY DEVICE AND METHOD OF OPERATING THE SAME

(75) Inventors: Won-joo Kim, Suwon-si (KR); Yoon-dong Park, Yongin-si (KR); Eun-hong Lee, Anyang-si (KR); Sun-ae Seo, Hwaseong-si (KR); Sang-min Shin, Seoul (KR); Jung-hoon Lee, Seoul (KR); Seung-hyuk Chang, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 636 days.

(21) Appl. No.: 11/249,393

(22) Filed: Oct. 14, 2005

(65) Prior Publication Data
US 2006/0097306 A1 May 11, 2006

(30) Foreign Application Priority Data
Nov. 9, 2004 (KR) ............... 10-2004-0090892

(51) Int. Cl.
*H01L 29/788* (2006.01)
*H01L 21/336* (2006.01)
(52) U.S. Cl. ............... 257/315; 438/263
(58) Field of Classification Search ............... 438/263; 257/104, 315, 317, 321, E27
See application file for complete search history.

(56) References Cited

U.S. PATENT DOCUMENTS

| | | | | |
|---|---|---|---|---|
| 6,040,210 A | * | 3/2000 | Burns et al. | 438/238 |
| 7,315,058 B2 | * | 1/2008 | Hikita | 257/316 |
| 7,465,983 B2 | * | 12/2008 | Eldridge et al. | 257/314 |

* cited by examiner

*Primary Examiner*—David S Blum
(74) *Attorney, Agent, or Firm*—Buchanan Ingersoll & Rooney PC

(57) ABSTRACT

A multi bits flash memory device and a method of operating the same are disclosed. The multi bits flash memory device includes: a stacked structure including: a first active layer with a mesa-like form disposed on a substrate; a second active layer, having a different conductivity type from the first active layer, formed on the first active layer; an active interlayer isolation layer interposed between the first active layer and the second active layer such that the first active layer is electrically isolated from the second active layer; a common source and a common drain formed on a pair of opposite side surfaces of the stacked structure; a common first gate and a common second gate formed on the other pair of opposite side surfaces of the stacked structure; a tunnel dielectric layer interposed between the first and second gates and the first and second active layers; and a charge trap layer, storing charges that tunnel through the tunnel dielectric layer, interposed between the tunnel dielectric layer and the first and second gates.

20 Claims, 15 Drawing Sheets

MULTI BITS FLASH MEMORY DEVICE AND METHOD OF OPERATING THE SAME

BACKGROUND OF THE INVENTION

This application claims the benefit of Korean Patent Application No. 10-2004-0090892, filed on Nov. 9, 2004, in the Korean Intellectual Property Office, the disclosure of which is incorporated herein in its entirety by reference.

1. Field of the Invention

The present invention relates to a semiconductor device, and more particularly, to a multi bits flash memory device using a complementary metal oxide semiconductor (CMOS) and a method of operating the same.

2. Description of the Related Art

In order to increase memory density, the sizes of memory cells can be reduced. Alternatively, memory density can be increased by increasing the number of possible states of charges in each memory cell. For example, it is reported a flash memory cell having multi floating gates that can assume 4 states and, therefore, store 2 bits simultaneously.

However, memory cells have often been embodied in two dimension-structures. Two-dimensional memory cells have, in general, a planar transistor structure in which source and drain regions are formed in a substrate, a channel is formed in a portion of the substrate between the source/drain region, and a gate is formed on the channel.

Such two-dimensional devices may be operated by two bits. For example, in a 2-dimentional planar transistor including a floating gate or a charge trap layer, both ends of the floating gate or the charge trap layer adjacent to source and drain regions are used as charge storage sites or storage nodes, thus implementing 2 bit operations. However, 2-dimentional devices are not suitable for multi-bit operation more than 3 bits in performing program, erase and read operations.

In addition, multi-level memory cells with 2-dimentional structures have been developed. Floating gates of such multi-level memory cells store charges in multi levels. In this case, in order to store more than 2 bits, for example, 4 bits, at least $2^4$, that is, 16 charge levels are required. In a nMOSFET device, a threshold voltage $V_{th}$ is expected to be about 3V at a doping concentration of about $1E+18/cm^3$, which can be increased as the number of the donor ($N_d$) increases and varies according to a doping concentration of a channel or a substrate. Therefore, a threshold voltage window ($\Delta V_{th}$) is expected to be 3V. Such a narrow threshold voltage window hinders the obtainment of various voltage levels of more than ten in the window range, and good program/erase and read operations.

Therefore, in order to implement more than 2 bits-operation in a memory cell, for example, 4 bits or 8 bits-operation, a new memory cell with at least two charge storage sites or storage nodes must be developed.

SUMMARY OF THE INVENTION

The present invention provides a multi bits flash memory device with a memory cell structure capable of storing more than 2 bits.

The present invention also provides a flash memory device including: a stacked structure including: a first active layer with a mesa-like form disposed on a substrate; a second active layer, having a different conductivity type from the first active layer, formed on the first active layer; an active interlayer isolation layer interposed between the first active layer and the second active layer such that the first active layer is electrically isolated from the second active layer; a common source and a common drain formed on a pair of opposite side surfaces of the stacked structure; a common first gate and a common second gate formed on the other pair of opposite side surfaces of the stacked structure; a tunnel dielectric layer interposed between the first and second gates and the first and second active layers; and a charge trap layer, storing charges that tunnel through the tunnel dielectric layer, interposed between the tunnel dielectric layer and the first and second gates.

When programming the flash memory device, a plurality of different states can be stored in the memory cell by combination of voltages applied to the first gate, the second gate, the assistant control electrode, and the first active layer.

For example, -15V to 15V can be applied to the first gate; -15V to 15V can be applied to the second gate; -10V to 10V can be applied to an assistant control electrode; and 0V can be applied to the first active layer or the first active layer can be grounded.

At this time, the source and the drain may be grounded or floated such that charges tunnel into the charge trap layer by a FN tunneling mechanism.

In addition, an electric field may be applied between the source and the drain to generate hot electrons such that charges are injected into the charge trap layer by a CHEI mechanism.

The present invention discloses a multi bits flash memory device with a memory cell structure capable of performing more than 2 bits.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

A 3-dimentional multi bits flash memory device according to embodiment of the present invention includes two active layers and an active interlayer isolation layer interposed therebetween. The active layers and the active interlayer isolation layer form a stacked structure in the form of a hexahedron. A source, a drain, and gates formed on side surfaces of the stacked structure. A channel is formed in each of the active layers, and the active interlayer isolation layer is used as an insulator. A common source and a common drain are formed on a pair of opposite side surfaces of the stacked structure, and common gates are formed on the other pair of opposite side surfaces of the stacked structure. A charge trap layer is interposed between the common gates and side surfaces of the active layers. Further, an assistant control electrode is formed on an upper active layer such that a body voltage can be applied to the upper active layer. In addition, the lower active layer is electrically connected to a substrate such that a body voltage can be applied to the lower active layer through the substrate.

In a cell including such a 3-dimentional memory device, the active layers have different conductivity types so that at least two charge storage nodes below a single gate, which store charges can be formed on either side of the stack of the active layers. Accordingly, a memory cell may have a total of 4 charge storage sites or 8 charge storage sites. Since the active layers have p-type conductivity and n-type conductivity, respectively, each of the gates formed on side surfaces of the active layers is a common gate of an nMOS-type transistor and pMOS-type transistor. Accordingly, at least two charge storage sites can be formed below the gate. In other words, charges can be independently stored in respective isolated charge storage nodes such that at least 4 bits programming/erasing and reading can be realized.

Figure 1:
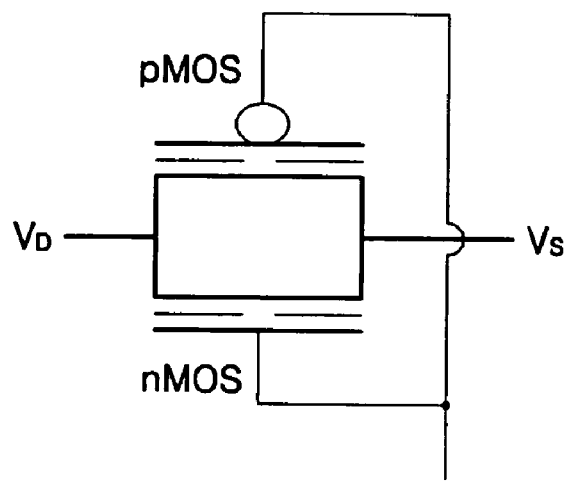
FIG. 1 is an equivalent circuit diagram of a multi bits flash memory device according to an embodiment of the present invention.

FIG. 1 is an equivalent circuit diagram of a multi bits flash memory device according to an embodiment of the present invention.

Referring to FIG. 1, the multi bits flash memory device includes a pMOS transistor and an nMOS transistor, which are operated through a common drain, a common source, and a common gate. A drain voltage $V_D$ is applied to both the nMOS transistor and the pMOS transistor through the common drain. A source voltage $V_S$ is applied to both the nMOS transistor and the pMOS transistor through the common source. Such a structure, in which the nMOS transistor and the PMOS transistor are commonly connected to and controlled through the common drain, the common source, and the common gate, can be realized by a first active layer and a second active layer stacked complementarily. The first active layer is used as an n channel of the nMOS transistor. The second active layer is used as a p channel of the pMOS transistor.

Figure 2:
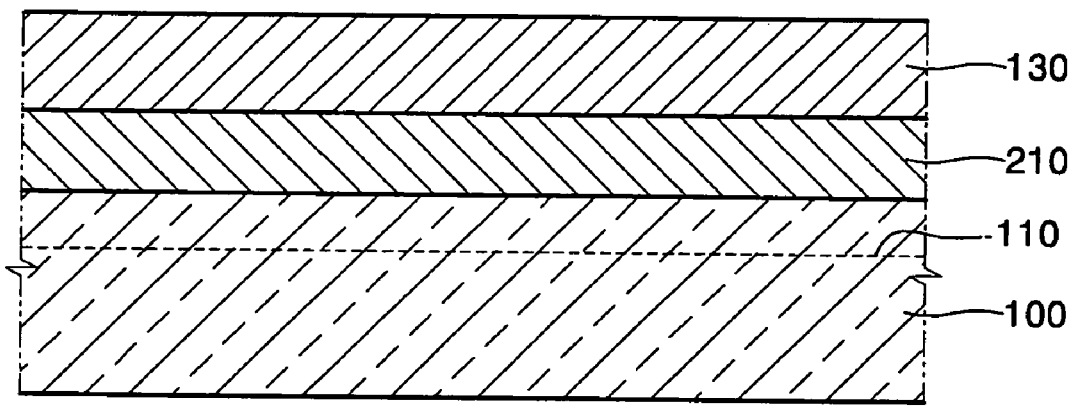
FIG. 2 is a sectional-view of a stack of active layers of a multi bits flash memory device according to an embodiment of the present invention.

FIG. 2 is a sectional-view of a stack of active layers of a multi bits flash memory device according to an embodiment of the present invention.

Referring to FIG. 2, in order to obtain a device with a structure in which the nMOS transistor and the pMOS transistor are commonly controlled through the common source, the common drain, and the common gate, a first active layer 110, an active interlayer isolation layer 210, and a second active layer 130 disposed sequentially on a substrate 100 can be used. For example, the active interlayer isolation layer 210, which may be composed of a bottom oxide (BOX), may be formed on a silicon substrate doped with an acceptor dopant with a concentration of $10E18/cm^3$, and the second active layer 130 formed on the active interlayer isolation layer 210 is used as an n-type conductive substrate. In this case, a predetermined thickness of the layer of the substrate 100 of the substrate 100 below the active interlayer isolation layer 210 can be used as the first active layer 110.

A stacked structure of the first active layer 110, the active interlayer isolation layer 210, and the second active layer 130 can be realized by forming a silicon on insulating (SOI) substrate. That is, an SOI substrate is formed and then conductivity types of the first active layer 110 and the second active layer 130 are converted, thus obtaining the stacked structure shown in FIG. 2.

The stacked structure is patterned to form a hexahedron on sides of which the common source, the common drain, and the common gate are formed.

Figure 3:
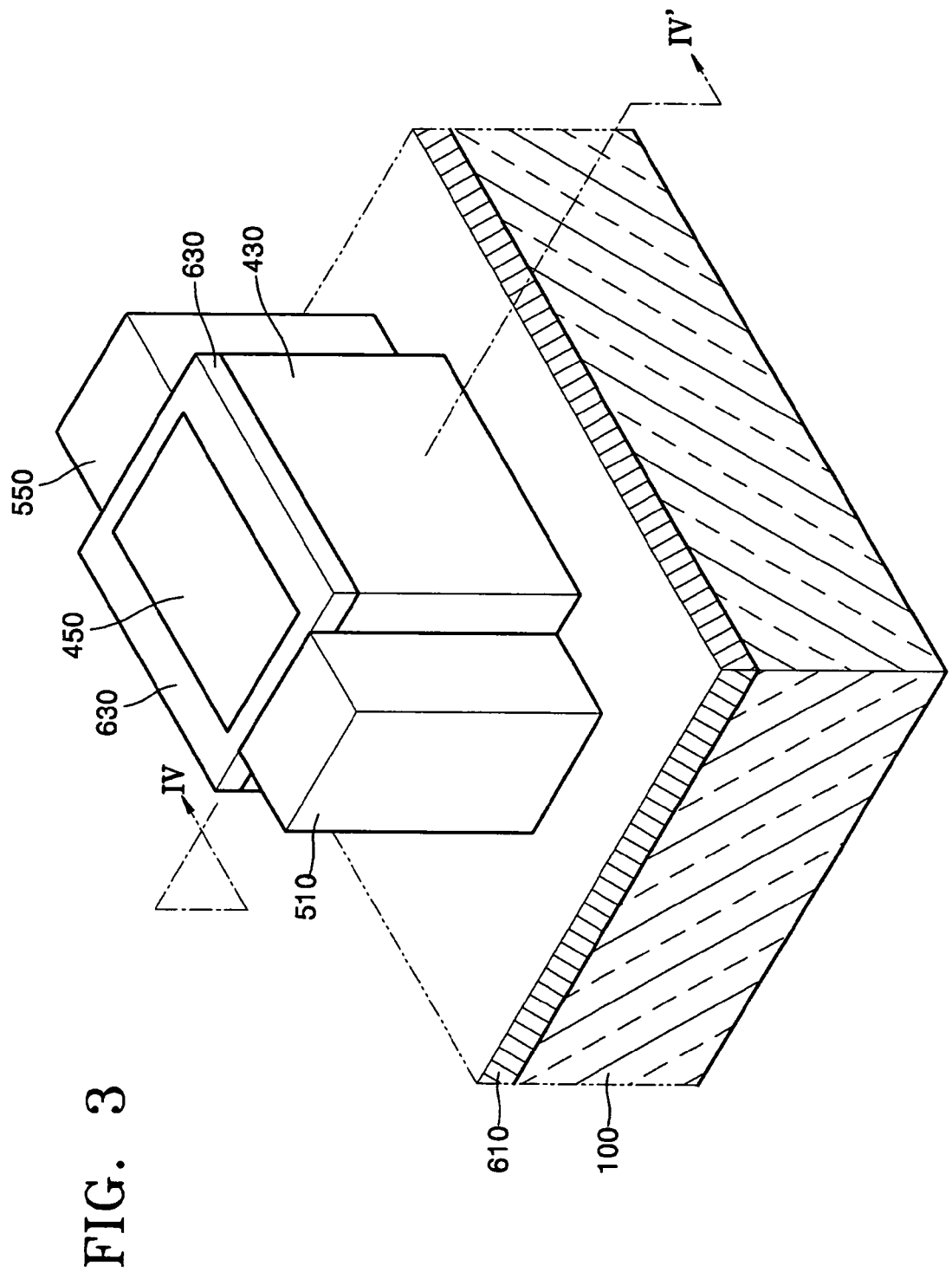
FIG. 3 is a perspective view of the multi bits flash memory device shown in FIG. 1.
Figure 4:
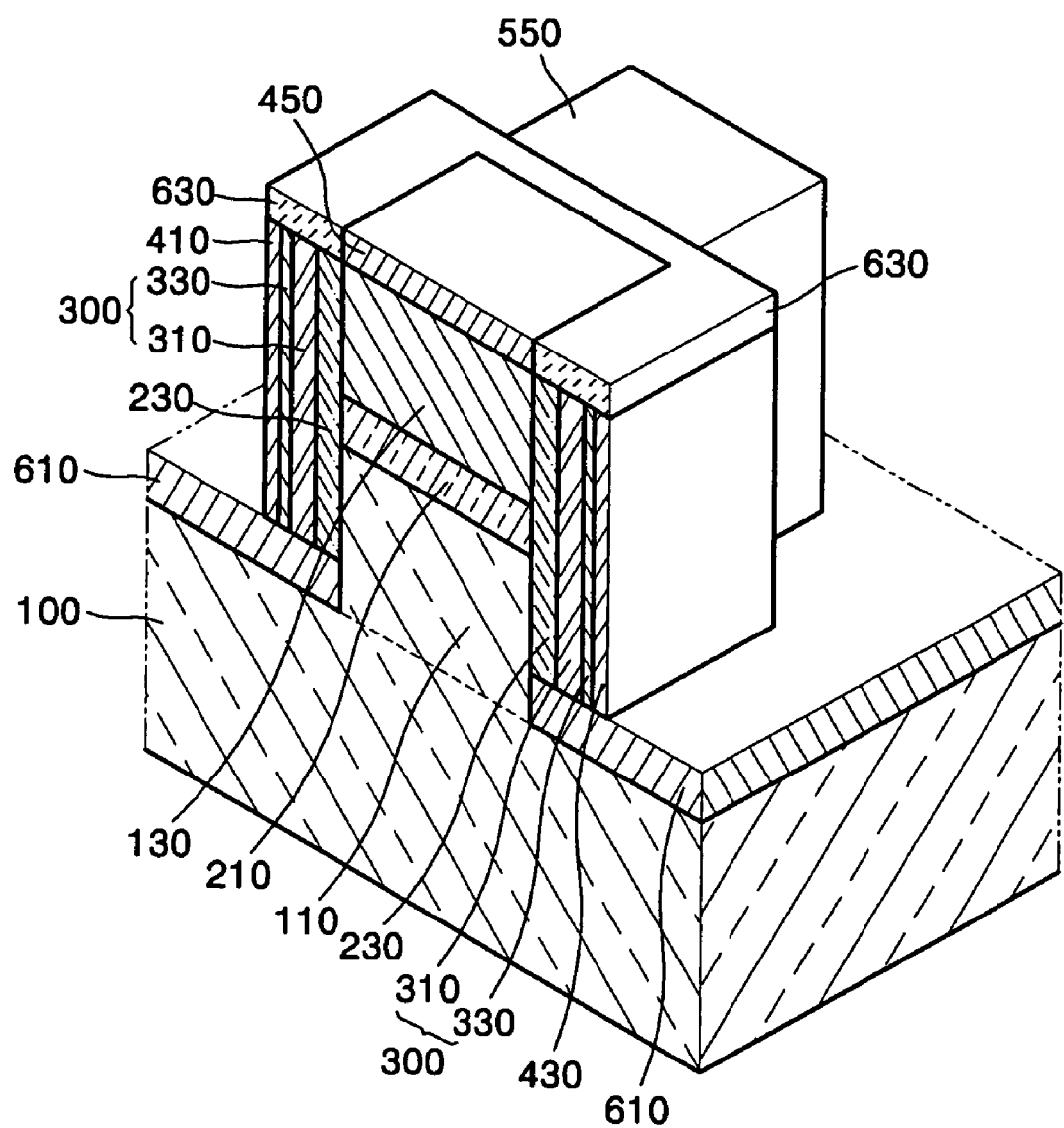
FIG. 4 is a sectional perspective view taken along a line IV-IV' shown in FIG. 3.
Figure 5:
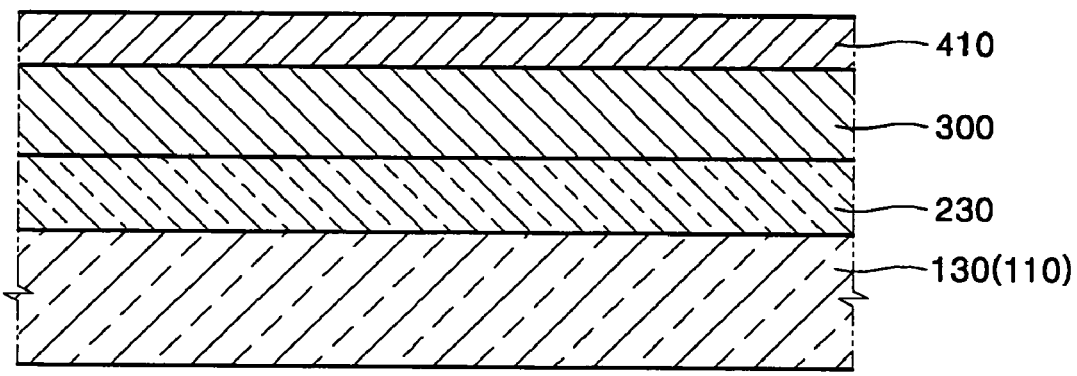
FIG. 5 is a sectional view of a multi bits flash memory device according to an embodiment of the present invention illustrating the location of a charge trap layer.

FIG. 3 is a perspective view of the multi bits flash memory device shown in FIG. 1. FIG. 4 is a sectional perspective view taken along a line IV-IV' shown in FIG. 3. FIG. 5 is a sectional view of a multi bits flash memory device according to an embodiment of the present invention illustrating the location of a charge trap layer.

Referring to FIGS. 3 and 4, the multi bits flash memory device includes the mesa-shaped first active layer 110, the active interlayer isolation layer 210, and the second active layer 130 stacked sequentially on the substrate 100. The first active layer 110 and the second active layer 130 may be doped as different conductivity types. The first active layer 110 and the second active layer 130 can be formed by, for example, optionally etching the second active layer 130, the active interlayer isolation layer 210, and the substrate 100 so that the first active layer 110 has a mesa-like form on SOI substrate shown in FIG. 2. In this case, the first and second active layers 110 and 130 and the active interlayer isolation layer 210 form a hexahedron.

The substrate 100 may be a p-type silicon substrate doped with a doping concentration or the number ($N_a$) of an acceptor of about $10E18/cm^3$. Accordingly, the first active layer 110 may be a p-type silicon layer, the same conductivity type as the substrate 100. The second active layer 130, which is an n-type silicon layer doped with a doping concentration or the number ($N_d$) of donor of about $10E18/cm^3$, may be formed on the active interlayer isolation layer 210. The active interlayer isolation layer 210 may be composed of BOX including an insulating material, such as silicon oxide. In this case, an n-channel of the nMOS transistor can be formed in the first active layer 110, and a p-channel of the pMOS transistor can be formed in the second active layer 130.

Referring to FIG. 3, the patterned first active layer 110, the active interlayer isolation layer 210, and the second active layer 130 may form a hexahedron. A source 510 and a drain 550 are formed on a pair of opposite side surfaces of the stacked structure. The source 510 and the drain 550 may be composed of a conducting material or a semiconducting material with conductivity. In addition, each of the source 510 and the drain 550 may cover side surfaces of both the first and second active layers 110 and 130. Therefore, the source 510 and the drain 550 can be respectively used as a common source and a common drain.

A first gate 410 and a second gate 430 are formed on the other pair of opposite side surfaces of the stacked structure. The first and second gates 410 and 430 may be composed of a conducting material, and cover side surfaces of both the two active layers 110 and 130. Accordingly, each of the first and second gates 410 and 430 is used as a common gate overlapping channels which are formed in the first and second active layers 110 and 130.

As a result, the first and second gates 410 and 430 can control two channels respectively formed in the first and second active layers 110 and 130 at the same time. That is, when a voltage is applied to the first gate 410 or the second gate 430, the voltage can flow through the n-channel in the first active layer 110, or through the p-channel in the second active layer 130.

A tunnel dielectric layer 230 composed of a dielectric material, such as a silicon oxide, is formed between the first and second gates 410 and 430 and side walls of the first and second active layers 110 and 130. The tunnel dielectric layer 230 allows charges to tunnel through channels formed in the first and second active layers 410 and 430.

Referring to FIG. 5, a charge trap layer 300 trapping the tunneled charges is formed between the tunnel dielectric layer 230 and the first gate 410 or between the tunnel dielectric layer 230 and the second gate 430. The charge trap layer 300 may be a material layer with a charge trap site such that charges can be locally stored. Such a material layer may be a silicon dot layer, a metal dot layer, a carbon nanotube layer, an oxide nitride oxide (ONO) layer used as a trapping layer in a silicon oxide nitride oxide silicon (SONOS) device, a ferromagnetic layer, a ferroelectric layer, a nano-wire layer, a quantum dot layer, or the like. Charges are injected into the charge trap layer 300 through the tunnel dielectric layer 230 by Fowler-Nordheim (FN) tunnelling or channel hot electron injection (CHEI). States of charges may vary according to whether the charge is trapped, and if trapped, where the charges are trapped.

Referring to FIG. 4, the charge trap layer 300 includes a silicon nitride layer ($Si_3N_4$) 310, and a silicon oxide layer 330 formed thereon. Since the first gate 410 or the second gate 430 extends along the first and second active layers 110 and 130 such that the first gate 410 or the second gate 430 is commonly shared by the first and second active layers 110 and 130, the charge trap layer 300 also extends along the side walls of the first and second active layers 110 and 130.

When charges are trapped in respective storage nodes, which are differentiated when the memory device according to the present embodiment is programmed, a body voltage may be applied to a body of the first active layer 410 or the second active layer 430. Applying a first body voltage to the substrate 100 may be substantially equivalent to applying the first body voltage to the first active layer 110 since the first active layer 110 is electrically connected to the substrate 100. A second body voltage is applied to the second active layer 130, independently from the first active layer 110. Thus, an assistant control electrode 450 electrically connected to the second active layer 130 is formed on an upper surface of the second active layer 130 such that the second body voltage need not be directly applied to the second active layer 130. The assistant control electrode 450 may be composed of a conducting material.

Since the first and second gates 410 and 430 are vertically formed on side surfaces of the active layer stack, a first insulator 610 can be formed between the first and second gates 410 and 430 and a surface of the substrate 100 below the first active layer 110. The first insulator 610 may be composed of a silicon oxide. In addition, a second insulator 630, composed of silicon oxide, may electrically isolate the assistant control electrode 450 from the first and second gates 410 and 430.

As mentioned above, the unit cell of the memory device according to the present embodiment includes a pMOS transistor and an nMOS transistor, which are complementarily combined. Therefore, the unit cell can be programmed by sequentially scanning and applying discontinuous voltages within a predetermined range, for example, about −5V to +5V to the first gate 410 or the second gate 430, applying a voltage $V_D$ of about 1V to a drain 530; and grounding a source 510 (Vs=0). The pMOS transistor and the nMOS transistor need different voltage conditions for formation of a channel and a current flow, thus being independently operated by the common gate 410 or the common gate 430, the common source 510, and the common drain 550.

Figure 6:
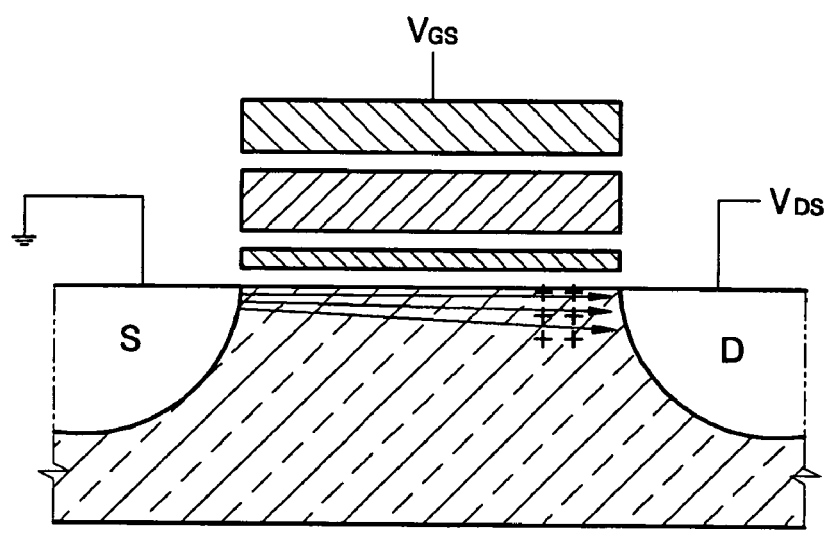
FIG. 6 is a sectional view of a pMOS transistor of a multi bits flash memory device according to an embodiment of the present invention.
Figure 7:
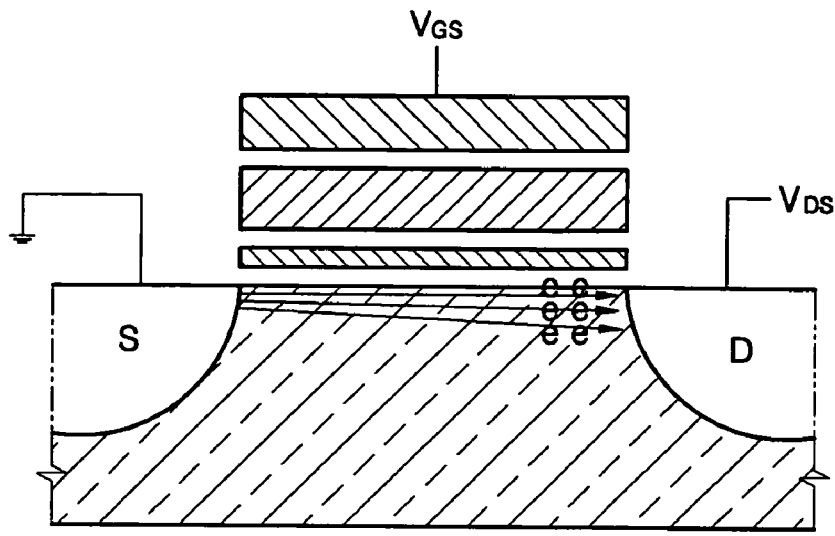
FIG. 7 is a sectional view of an nMOS transistor of a multi bits flash memory device according to an embodiment of the present invention.

FIG. 6 is a sectional view of a pMOS transistor of a multi bits flash memory device according to an embodiment of the present invention. FIG. 7 is a sectional view of an nMOS transistor of a multi bits flash memory device according to an embodiment of the present invention.

Referring to FIG. 6, in the pMOS transistor, when a voltage $V_{DS}$ between a drain and a source is about −3V and a voltage $V_{GS}$ between a gate and the source is about −3V, a channel is formed and a current flows. At this time, a voltage $V_{BS}$ between a substrate body and the source may be floated, or grounded. Referring to FIG. 7, in the nMOS transistor, when the voltage $V_{DS}$ between the drain and the source is about −3V and the voltage $V_{GS}$ between the gate and the source is about −3V, a channel is formed and a current flows. Meanwhile, a voltage $V_{GS}(p)$ for FN-tunneling in the pMOS transistor is greater than a voltage $V_{GS}(n)$ for FN-tunneling in the nMOS transistor.

Therefore, referring to FIG. 4, the pMOS transistor and the nMOS transistor having the common gate 410 or 430 operate independently. That is, according to a voltage applied to respective gates and the source/drain, the nMOS transistor operates as shown in FIG. 7, or, the pMOS transistor operates as shown in FIG. 6.

That is, the pMOS transistor and the nMOS transistor have different threshold voltages $V_{th}$. The difference in threshold voltages is used to independently perform program and/or read operations with the nMOS transistor or the pMOS transistor formed below the common gate 410 or 430. The threshold voltage $V_{th}$ may vary according to a concentration of a dopant in the substrate, that is, a doping concentration of the fist active layer 110 and a concentration of a dopant in the second active layer 130.

Figure 8:
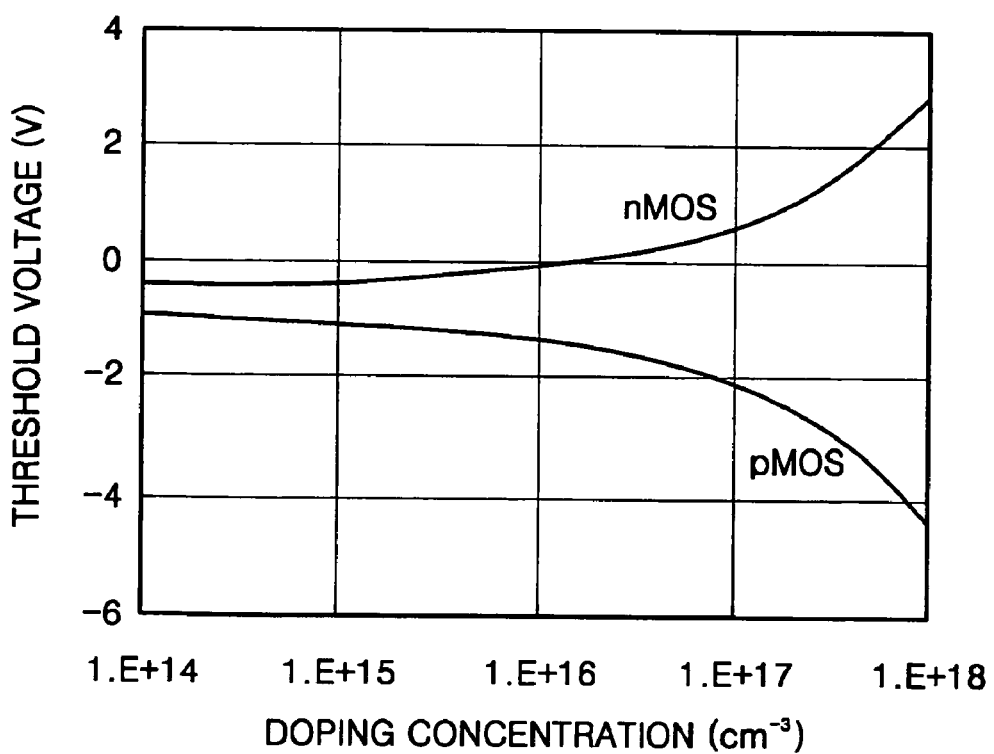
FIG. 8 is a graph of a threshold voltage (V) with respect to a doping concentration of a multi bits flash memory device according to an embodiment of the present invention.
Figure 9:
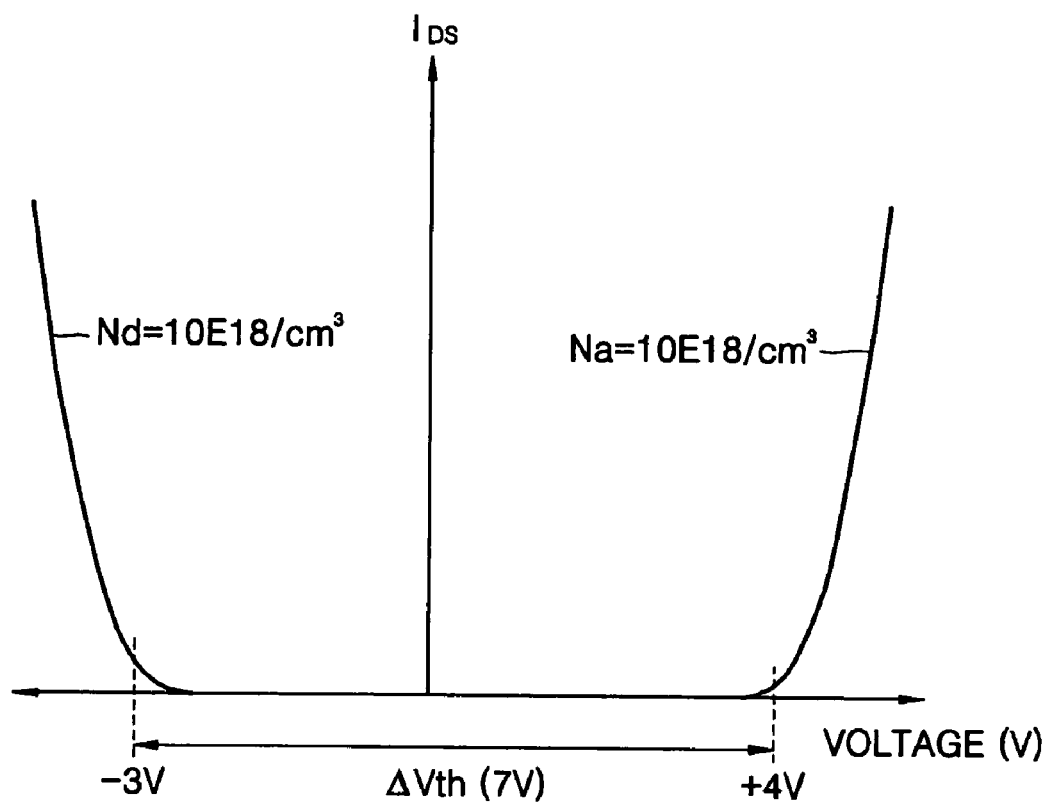
FIG. 9 is a graph of a drain-source current with respect to a gate voltage of a multi bits flash memory device according to an embodiment of the present invention.

FIG. 8 is a graph of a threshold voltage with respect to a doping concentration of a multi bits flash memory device according to an embodiment of the present invention. FIG. 9 is a graph of a drain-source current with respect to a gate voltage of a multi bits flash memory device according to an embodiment of the present invention; and Referring to FIG. 8, an increase in a concentration of a dopant, such as a donor or an acceptor ($N_d$ or $N_a$) doped in the first active layer 110 and the second active layer 130 results in an increase of the threshold voltage. At this time, the first active layer 110 has a different polarity from the second active layer 130. FIG. 9 illustrates a drain-source current with respect to a gate voltage when $N_d$ and $N_a$ are $10E18/cm^3$. Referring to FIG. 9, it is confirmed that the complementary combination of the pMOS transistor and the nMOS transistor results in a threshold voltage window ($\Delta V_{th}$) of about 7V. Accordingly, when pMOS and nMOS transistors have different threshold voltages, various levels for storing data can be obtained. In order to perform a multi-level operation, the threshold voltage window must be large. In general, a conventional nMOS transistor has a threshold voltage window of −3 V, and a conventional pMOS transistor has a threshold voltage window of +4 V. On the other hand, according to an embodiment of the present invention, as is illustrated in FIG. 9, the threshold voltage window is in the range of −3V to +4V, that is, the threshold voltage window has a size of 7 V. As a result, the number of stored bits can be increased.

Figure 10:
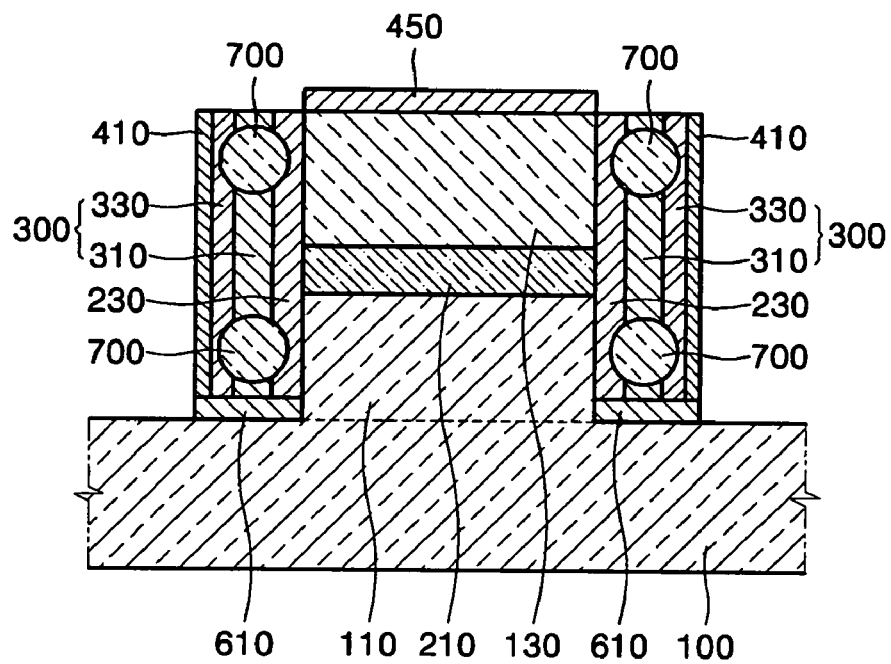
FIG. 10 is a sectional view of the multi bits flash memory device of FIG. 1 illustrating charge storage sites.

FIG. 10 is a sectional view of the multi bits flash memory device of FIG. 1 illustrating a charge storage site.

Referring to FIG. 10, the memory device according to the present embodiment may have four charge storage sites or charge storage nodes 700 in which charges are trapped by the FN tunneling mechanism. An electric field applied to respective charge storage nodes 700 may have various strengths and directions according to bias applied to the device. Therefore, by applying various electric fields to the device by changing variables such as a gate voltage ($V_G$), a drain voltage ($V_D$), a source voltage ($V_S$), a body voltage ($V_B$), and the like, charges are trapped using the FN tunneling mechanism. A programming operation using the FN tunneling mechanism will be exemplified be the following method.

FIGS. 11 through 26 are sectional views illustrating the operation of the multi bits flash memory of FIG. 1.

Figure 11:
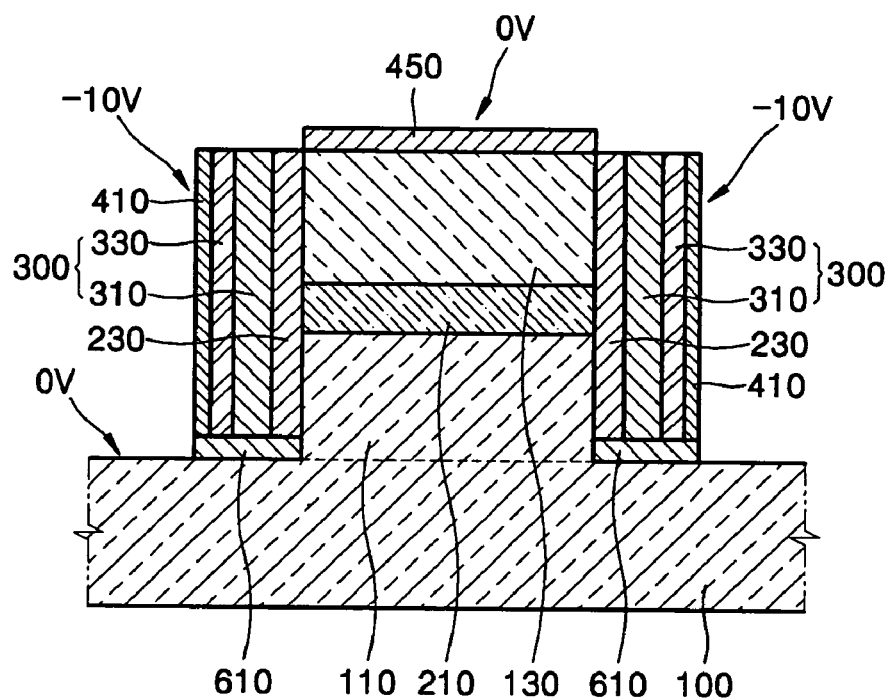
FIGS. 11 through 26 are sectional views illustrating operation of the multi bits flash memory device of FIG. 1.

Referring to FIG. 11, when the first active layer 110 is a p-type substrate, and the second active layer 130 is an n-type substrate, about −10V is applied to each of the first and second gates 410 and 430, and 0V is applied to each of the assistant control electrode 450 and the substrate 100. In this case, tunneling or trapping of charges does not occur. Therefore, such conditions are suitable for programming data of [0000] in the memory device.

Figure 12:
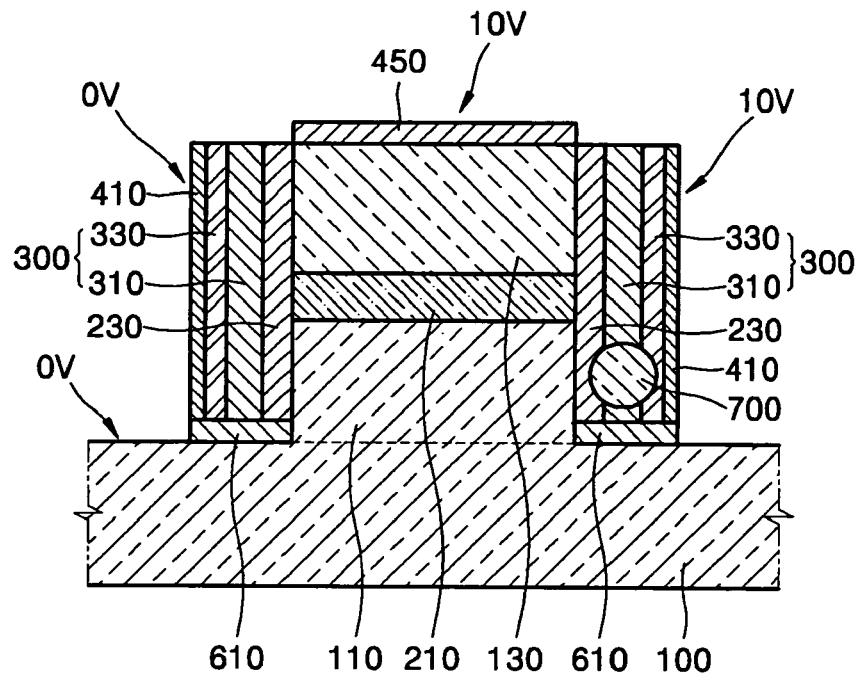

Referring to FIG. 12, about 0V is applied to the first gate 410, about 10V is applied to the second gate 430, a first body voltage of about 0V is applied to the first active layer 110 via through the substrate 100, and a second body voltage of about 10V is applied to the second active layer 130 via the assistant control electrode 450. In this case, the 10V between the first active layer 110 and the second gate 430 generates an electric field causing charges to be locally trapped in the charge trap layer 300 between the first active layer 110 and the second gate 430. Therefore, such conditions are suitable for programming data of [0001] in the memory device.

Figure 13:
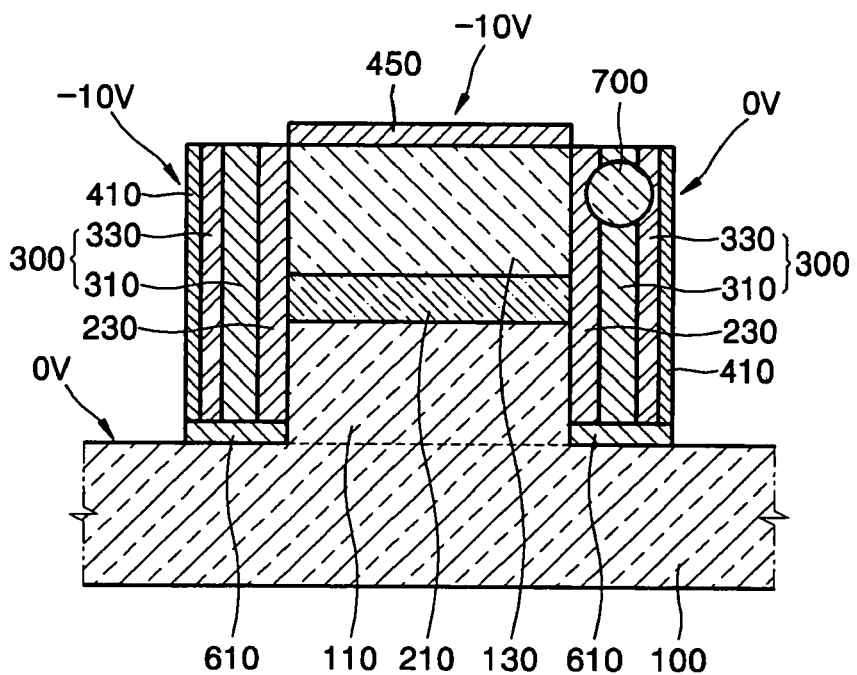

Referring to FIG. 13, about −10V is applied to the first gate 410, about 0V is applied to the second gate 430, a first body voltage of about 0V is applied to the first active layer via the substrate 100, and the second body voltage of about −10V is applied to the second active layer 130 via the assistance control electrode 450. In this case, the 10V between the second active layer 130 and the second gate 430 generates an electric field causing charges to be locally trapped in the charge trap layer 300 between the second active layer 130 and the second gate 430. That is, charges are locally trapped in the charge storage node 700. Therefore, such conditions are suitable for programming data of [0010] in the memory device.

Figure 14:
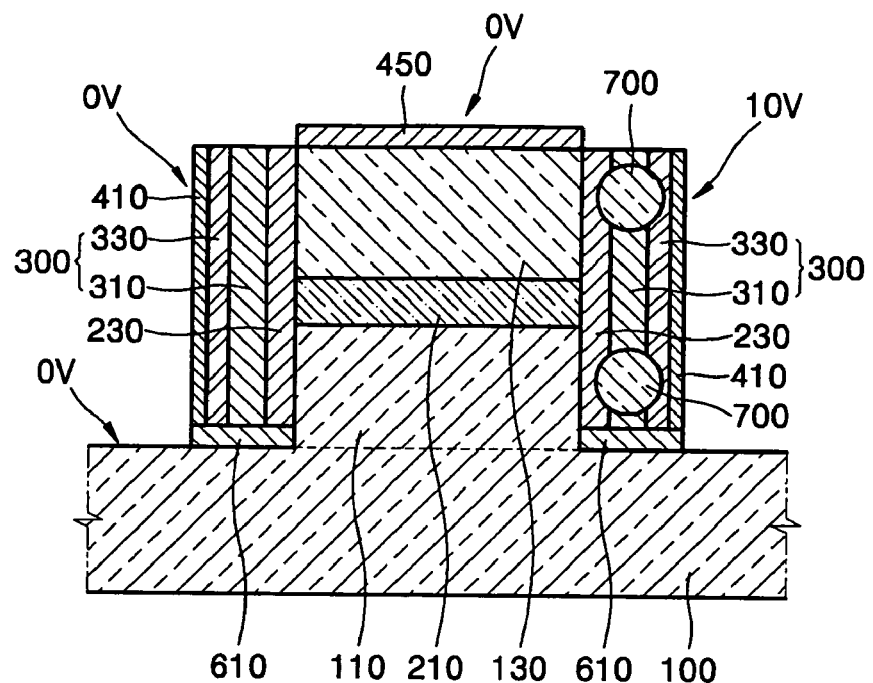
Figure 15:
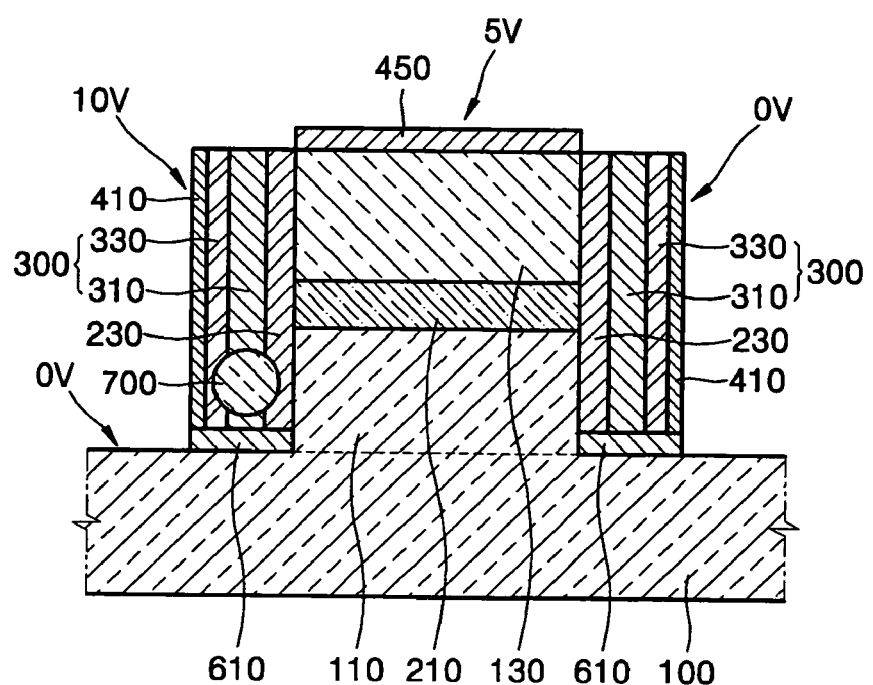
Figure 16:
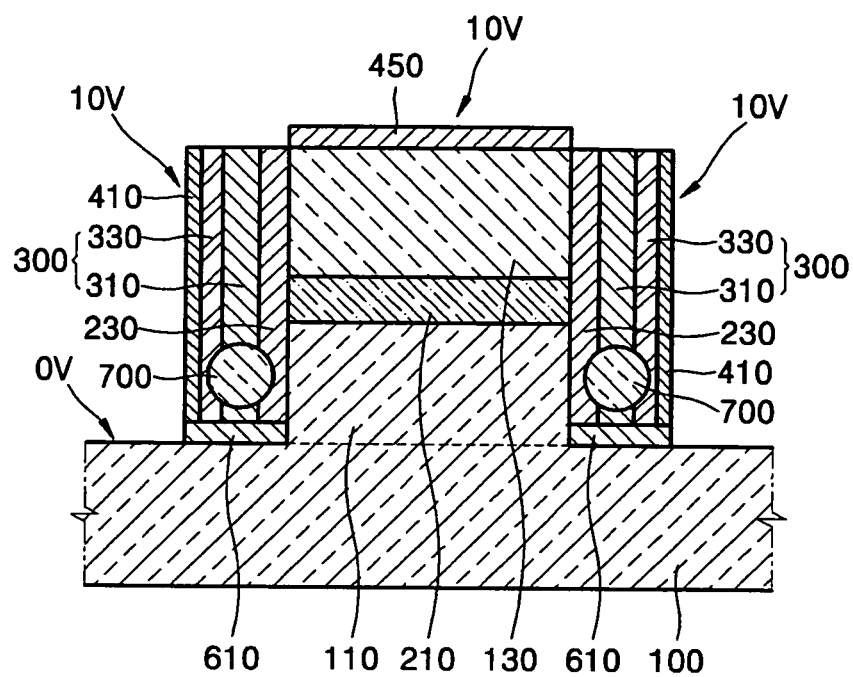
Figure 17:
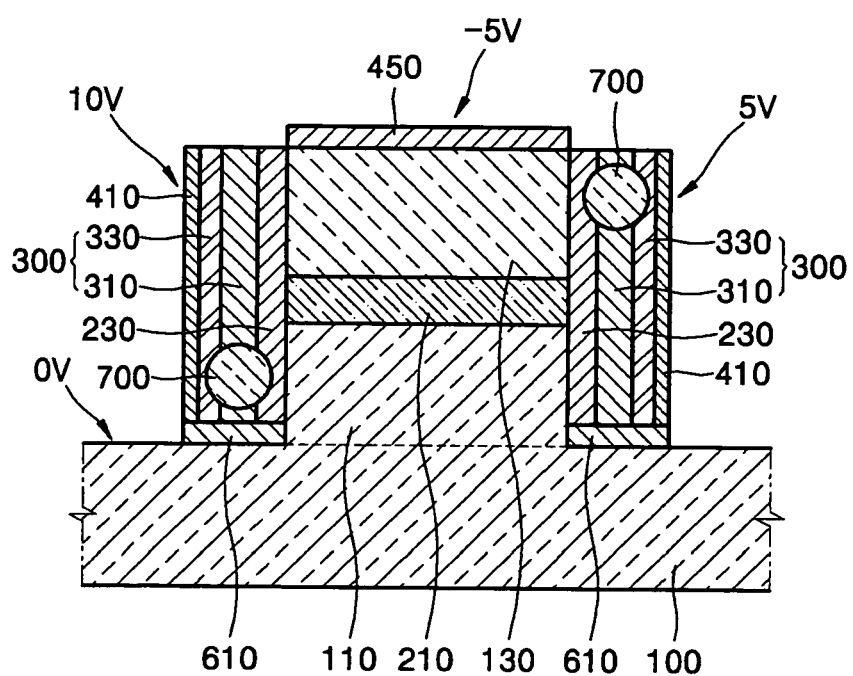
Figure 18:
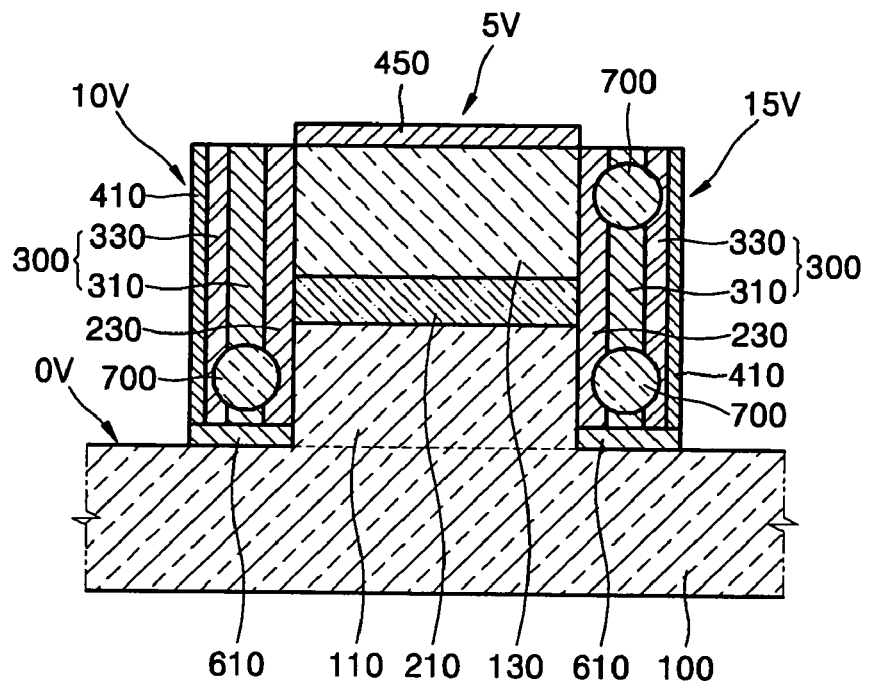
Figure 19:
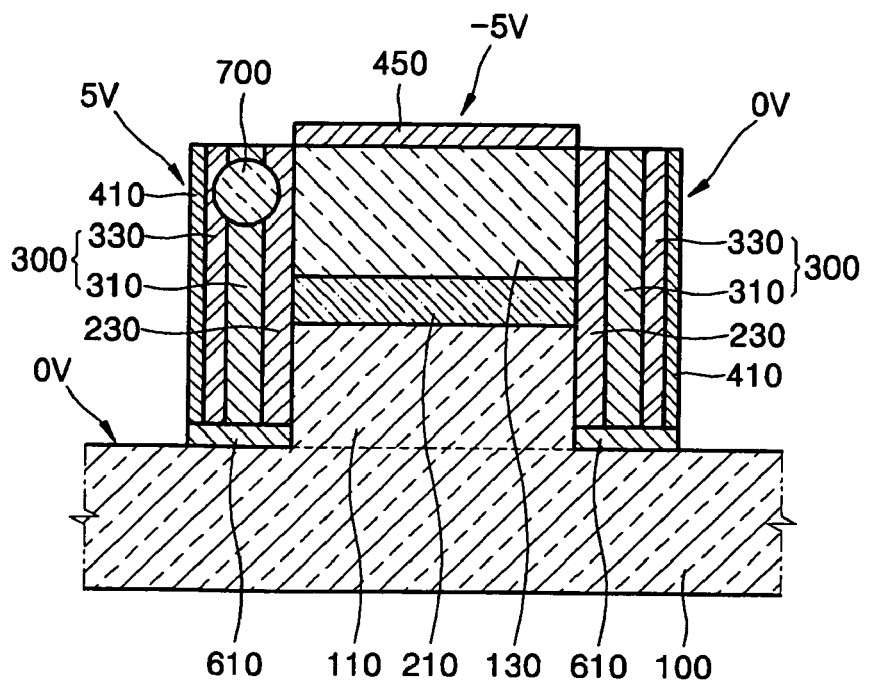
Figure 20:
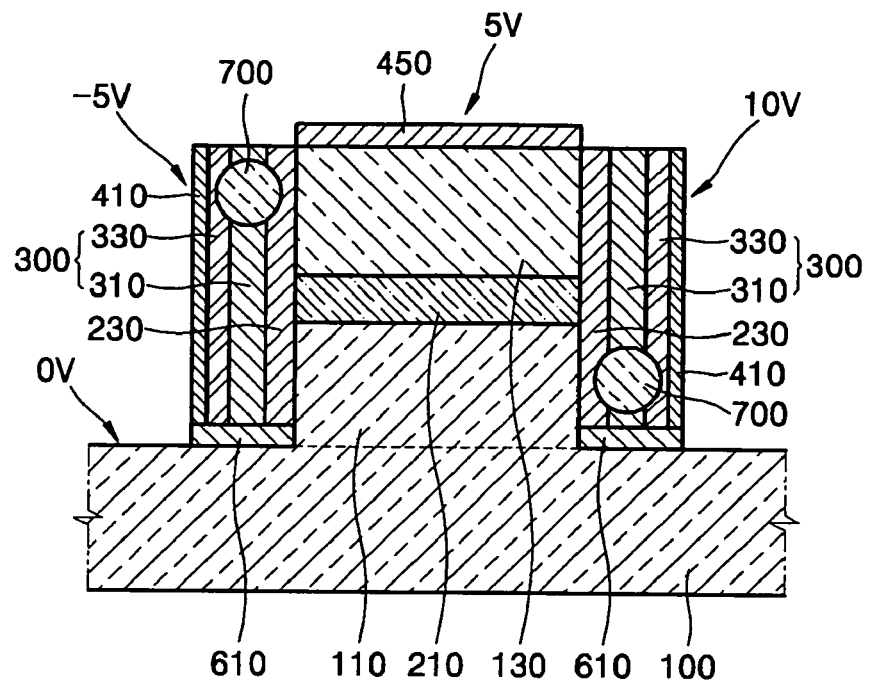
Figure 21:
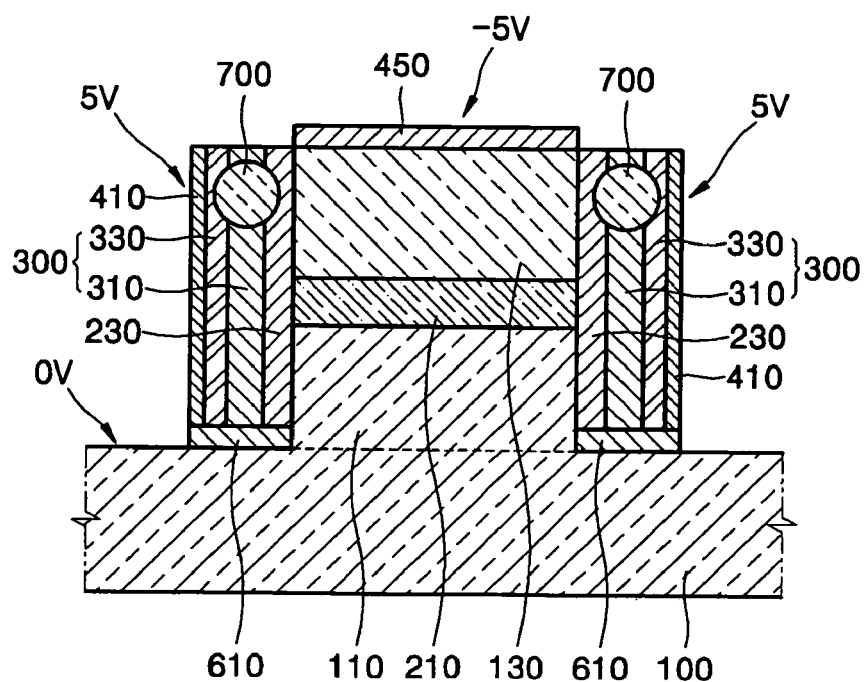
Figure 22:
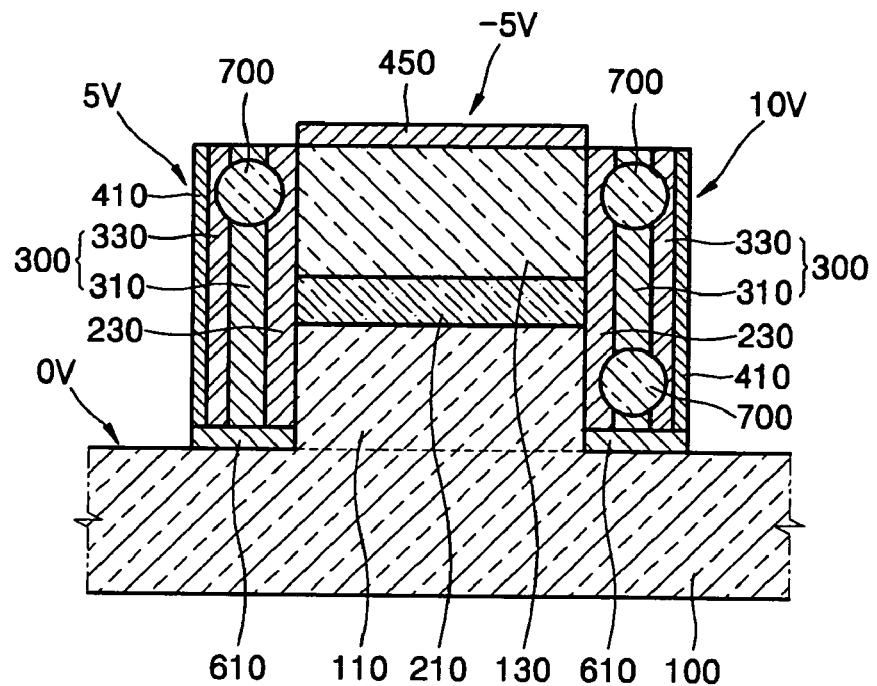
Figure 23:
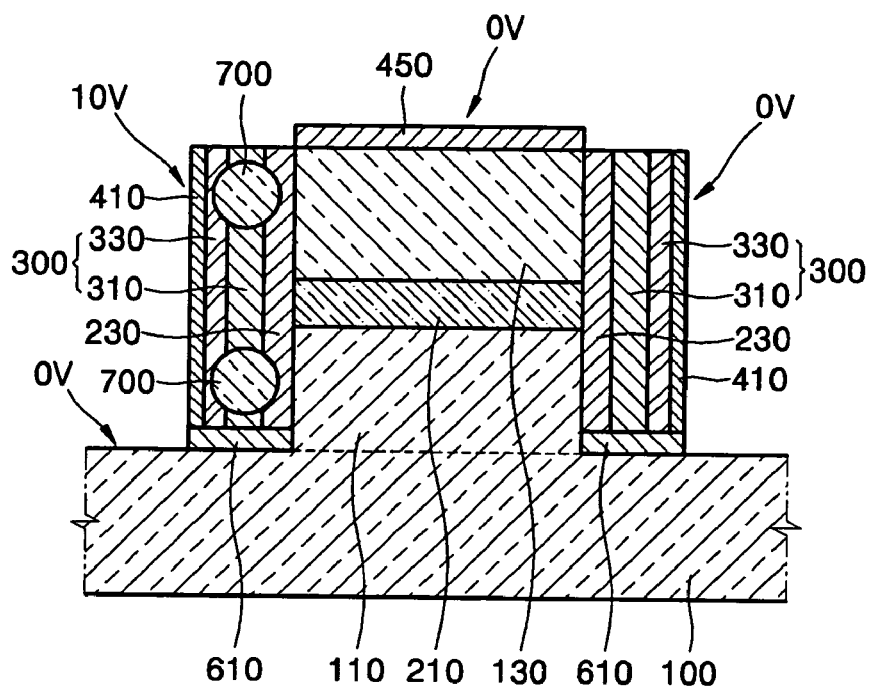
Figure 24:
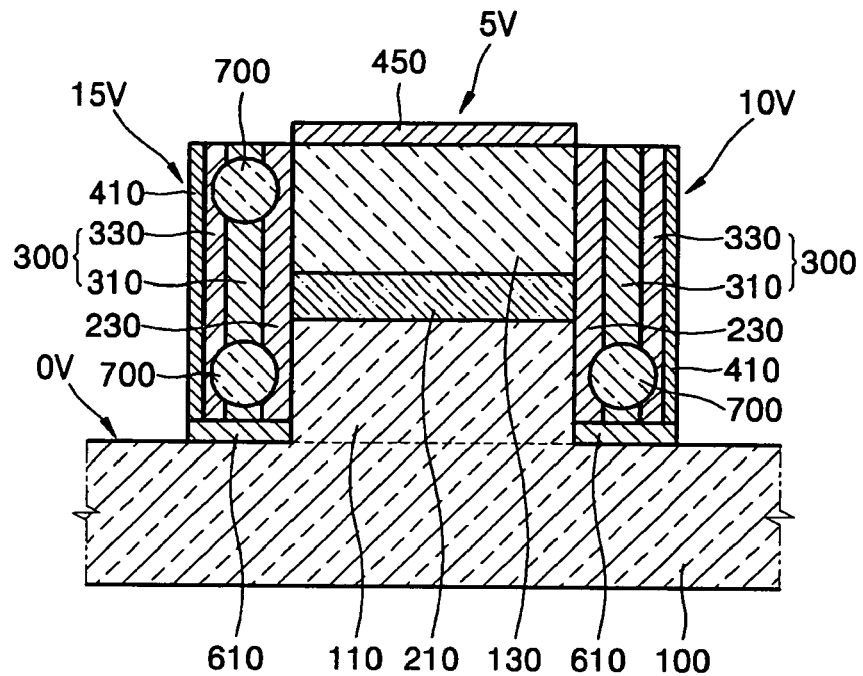
Figure 25:
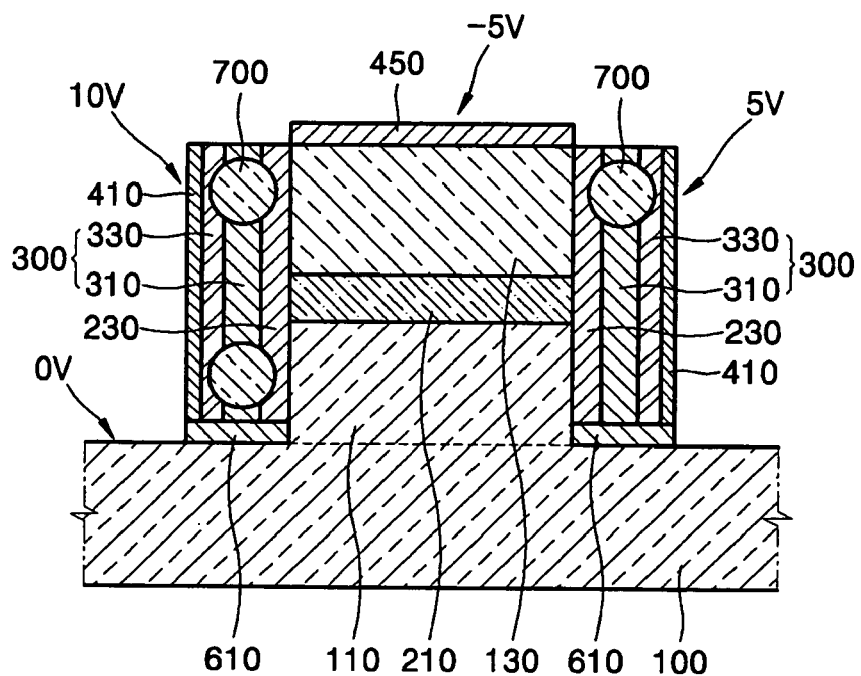
Figure 26:
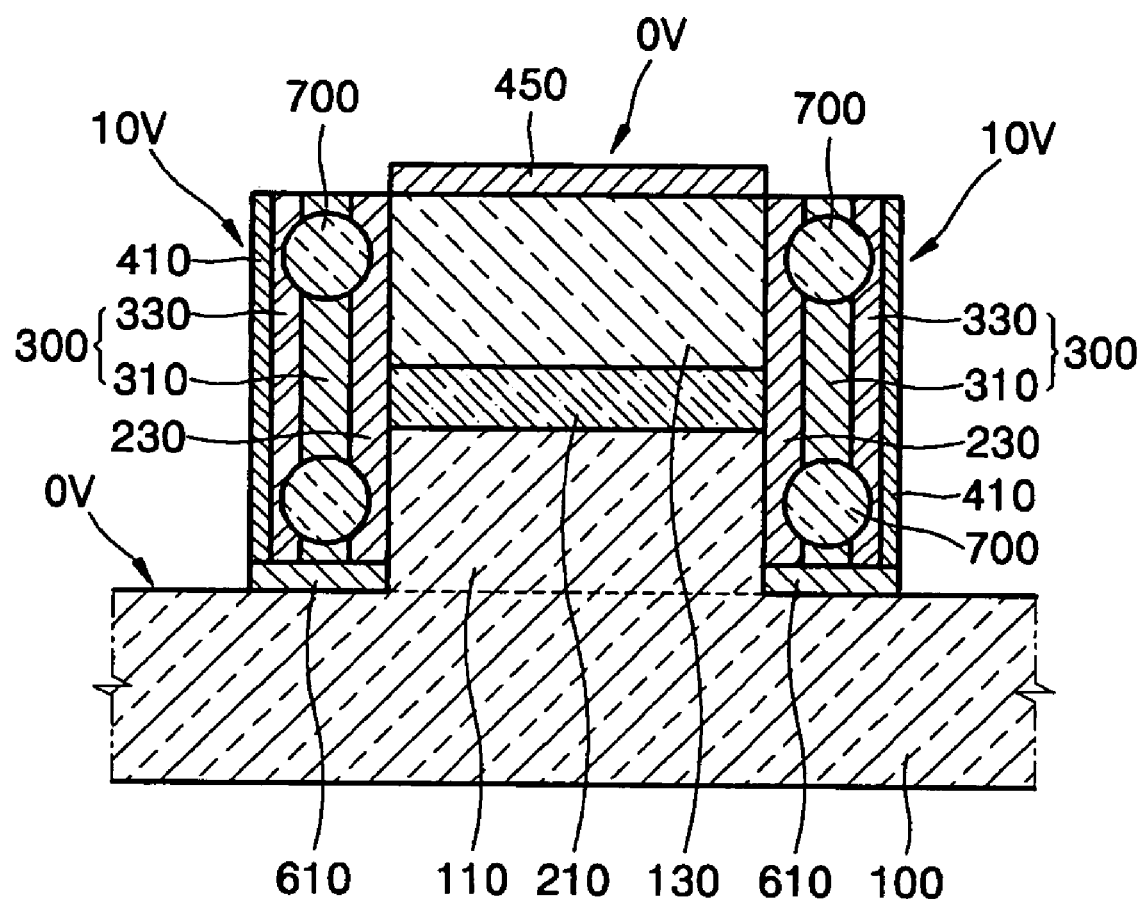

Referring to FIG. 14, about 0V is applied to the first gate 410, about 10V is applied to the second gate 430, a first body voltage of about 0 V is applied to the first active layer 110 via the substrate 100, and a second body voltage of about 0 V is applied to the second active layer via the assistant control electrode 450. In this case, the 10V between the first and second active layers 110 and 130 and the second gate 43 generates an electric field causing charges to be locally trapped in the two charge storage nodes 700 between the first and second active layer 110 and 130 and the second gate 430. Therefore, such conditions are suitable for programming data of [0011] in the memory device.

Referring to FIGS. 15 through 18, about 10V is applied to the first gate 410, about 0V, 10V, 5V, and 15V are applied to the second gate 430, respectively, a first body voltage of about 0 V is applied to the first active layer 110 via the substrate 100, and a second body voltage of about 5V, 10V, −5V, and 5V is applied to the second active layer 130 via the assistant control electrode 450, respectively. Such conditions are respectively suitable for programming data of [0100], [0101], [0110], and [0111] in the memory device.

Referring to FIGS. 19 through 22, about 5V, −5V, 5V, and 5V are applied to the first gate 410, respectively, about 0V, 10V, 5V, and 15V are applied to the second gate 430, respectively, a first body voltage of about 0V is applied to the first active layer 110 via the substrate 100, and a second body voltage of about −5V, 5V, −5V, and 5V is applied to the second active layer 130 via the assistant control electrode 450, respectively. Such conditions are respectively suitable for programming data of [1000], [1001], [1010], and [1011] in the memory device.

Referring to FIGS. 23 through 26, about 10V, −15V, 10V, and 10V are applied to the first gate 410, respectively, about 0V, 10V, 5V, and 10V is applied to the second gate 430, respectively, a first body voltage of about 0V is applied to the first active layer 110 via the substrate 100, and a second body voltage of about −0V, 5V, −5V, and 0V is applied to the second active layer 130 via the assistant control electrode 450, respectively. Such conditions are respectively suitable for programming data of [1100], [1101], [1110], and [1111] in the memory device.

As mentioned above, the strength and direction of an electric field applied to the four storage nodes 700 varies according to a bias applied to the device. Charges are trapped in the four storage nodes 700 in response to the electric field. That is, 16 states of an electric field can be realized by an FN tunneling mechanism such that 4 bits can be stored in the memory device according to the present embodiment. In other words, the programming operation can be independently performed at each of the charge storage nodes 700. Such independent operations make it possible for the programming operation to be performed at high speed.

Referring to FIGS. 11 through 26, the programming operation is performed using the FN tunneling mechanism. However, a CHEI mechanism can also be used for the programming operation. The use of the CHEI mechanism allows charges to be locally stored such that the number of electric field states increases. For example, 32 electric field states (or charge stored states) can be obtained. In addition, by dividing the value of the threshold voltage or more precisely dividing the charge storages sites, the number of the electric field states can be increased. Accordingly, the memory device according the present embodiment can store more than 4 bits, for example, 8 bits.

The stored data can be erased using the FN tunneling mechanism at once. Or, the electric field at the charge storage nodes 700 may be changed by independently changing the voltages applied to the each of charge storage nodes 700 of the memory device. That is, the data stored in each of the storage nodes can be independently erased at a high speed.

In addition, the reading operation may be performed by scanning the first gate 410 with a voltage in the range of −5V to 5V, scanning the second gate 430 with a voltage in the range of −5V to 5V, applying 1V to the drain 550, and applying 0V to the source 510 or floating the source 510. At this time, the first gate 410 and the scanning of the second gate 430 are independently scanned. In this case, by combining voltages independently applied to the first gate 410 and the second gate 430 and detected currents, data which are stored in the charge storage nodes 700, may be read. Independent reading by each of the first gate 410 and the second gate 430 results in an increase in a reading rate.

As mentioned above, a multi bits flash memory device according to an embodiment of the present invention includes: a stacked structure having a hexahedral mesa-like form and comprising a first active layer formed on a substrate, and a second active layer formed on the first active layer and having a different conductivity type from the first active layer; an active interlayer isolation layer interposed between the first active layer and the second active layer such that the first active layer is electrically isolated from the second active layer; a common source and a common drain formed on a pair of opposite side surfaces of the stacked structure, respectively; a common first gate and a common second gate formed on the other pair of opposite side surfaces of the stacked structure, respectively; a tunnel dielectric layer formed between the first and second gates and the first and second active layers; and a charge trap layer, storing charges that tunnel through the tunnel dielectric layer, interposed between the tunnel dielectric layer and the first and second gates.

The multi bits flash memory device may further include an assistant control electrode, connected to the second active layer, through which a body voltage is applied. In addition, the substrate may be electrically connected to the first active layer, and dopants used to dope the substrate and the first active layer may have the same conductivity type. The first active layer may be formed by patterning the substrate with a mesa-like form.

In addition, a flash memory device according to an embodiment of the present invention includes: two nMOS transistors, having a common source, a common drain, independent gates, and a charge trap layer formed below the independent gate formed on a substrate; two pMOS transistors, having the common source, the common drain, independent gates, and a charge trap layer; and an isolation layer formed between the nMOS transistors and the pMOS transistors such that an n-channel and a p-channel are electrically separated.

The two nMOS transistors use a common p-type first active layer, and the two pMOS transistors use a common n-type second active layer, which is separated from the first active layer by the isolation layer and forms a stacked structure with the first active layer and the isolation layer. The gates may be formed on a pair of opposite side surfaces of the stack of the first active layer and the second active layer, respectively. The source and the drain may be formed on the other pair of opposite side surfaces of the stack.

The 3-dimensional flash memory device according to an embodiment of the present invention may have at least 4 charge storage nodes. By combining various voltage conditions and various electric field conditions, the memory device can store at least 4 bits, for example 4 bits or 8 bits.

Program/erase and read operations can be performed in each of more than 4 charge storage nodes. That is, independent program/write and read operations can be realized. The independent operation allows high-speed program/erase and read operations. In addition, retention characteristics and reliability can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flash memory device comprising:
a stacked structure comprising:
a first active layer with a mesa-like form disposed on a substrate;
a second active layer, having a different conductivity type from the first active layer, formed on the first active layer;
an active interlayer isolation layer interposed between the first active layer and the second active layer such that the first active layer is electrically isolated from the second active layer;
a common source and a common drain formed on a pair of opposite side surfaces of the stacked structure;
a common first gate and a common second gate formed on the other pair of opposite side surfaces of the stacked structure;
a tunnel dielectric layer interposed between the first and second gates and the first and second active layers; and
a charge trap layer, storing charges that tunnel through the tunnel dielectric layer, interposed between the tunnel dielectric layer and the first and second gates.

2. The flash memory device of claim 1, wherein the substrate is electrically connected to the first active layer, and dopants doped into the substrate and the first active layer have the same conductivity type.

3. The flash memory device of claim 2, wherein the first active layer comprises a silicon layer doped with a p-type dopant and the second active layer comprises a silicon layer doped with an n-type dopant.

4. The flash memory device of claim 1, wherein the first active layer is formed by patterning a surface of the substrate into a mesa-like form.

5. The flash memory device of claim 1, further comprising an assistant control electrode connected to the second active layer and through which a body voltage is applied to the second active layer.

6. The flash memory device of claim 1, wherein the first gate and the second gate cover side surfaces of the first active layer and the second active layer.

7. The flash memory device of claim 1, wherein the charge trap layer comprises a silicon dot layer, a metal dot layer, a carbon nanotube layer, an oxide nitride oxide layer, a ferromagnetic layer, a ferroelectric layer, a nano-wire layer, or a quantum dot layer.

8. The flash memory device of claim 1, wherein the stacked structure is a hexahedron.

9. Flash memory device comprising:
a stacked structure having a hexahedral mesa-like form and comprising:
a first active layer formed on a substrate; and
a second active layer formed on the first active layer and having a different conductivity type from the first active layer;
an active interlayer isolation layer, which is interposed between the first active layer and the second active layer such that the first active layer is electrically isolated from the second active layer;
an assistant control electrode connected to the second active layer and through which a body voltage is applied to the second active layer;
a common source and a common drain formed on a pair of opposite side surfaces of the stacked structure;
a common first gate and a common second gate formed on the other pair of opposite side surfaces of the stacked structure;

a tunnel dielectric layer interposed between the first and second gates and the first and second active layers; and a charge trap layer, storing charges that tunnel through the tunnel dielectric layer, interposed between the tunnel dielectric layer and the first and second gates.

10. The flash memory device of claim 9, wherein the substrate is electrically connected to the first active layer, and dopants doped into the substrate and the first active layer have the same conductivity type.

11. The flash memory device of claim 10, wherein the first active layer comprises a silicon layer doped with a p-type dopant and the second active layer comprises a silicon layer doped with an n-type dopant.

12. The flash memory device of claim 9, wherein the first active layer is formed by patterning a surface of the substrate into a mesa-like form.

13. A flash memory device comprising:
two nMOS transistors having a common source and a common drain, and each having an independent gate and a charge trap layer formed below the independent gate;
two pMOS transistors, having a common source and a common drain, and each having an independent gate and a charge trap layer formed on the nMOS transistors; and
an isolation layer interposed between the nMOS transistors and the pMOS transistors such that an n-channel is electrically isolated from a p-channel.

14. The flash memory device of claim 13, wherein the two nMOS transistors have a common p-type first active layer and the two pMOS transistors have an common n-type second active layer, and the p-type first active layer and the n-type second active layer are separated by an isolation layer.

15. The flash memory device of claim 14, wherein the first active layer and the second active layer form a stacked structure and the gates are formed on a pair of opposite side surfaces of the stacked structure, and the source and the drain are formed on the other pair of opposite side surfaces of the stacked structure.

16. The flash memory device of claim 15, wherein the first active layer is electrically connected to a substrate through which a body voltage is applied to the first active layer, and the second active layer is connected to an assistant control electrode through which a body voltage is applied to the second active layer.

17. A method of operating a flash memory device, the method comprising storing various states in a memory cell by applying predetermined combinations of voltages to a first gate, a second gate, an assistant control electrode, and a first active layer of the memory cell, wherein the memory cell comprises:
a stacked structure having a hexahedral mesa-like form and comprising:
the first active layer formed on a substrate; and
a second active layer formed on the first active layer and having a different conductivity type from the first active layer;
an active interlayer isolation layer, which is interposed between the first active layer and the second active layer such that the first active layer is electrically isolated from the second active layer;
the assistant control electrode connected to the second active layer and through which a body voltage is applied to the second active layer;
a common source and a common drain formed on a pair of opposite side surfaces of the stacked structure;
the common first gate and the common second gate formed on the other pair of opposite side surfaces of the stacked structure;
a tunnel dielectric layer interposed between the first and second gates and the first and second active layers; and
a charge trap layer, storing charges that tunnel through the tunnel dielectric layer, interposed between the tunnel dielectric layer and the first and second gates.

18. The method of claim 17, wherein
−15 V to 15 V is applied to the first gate;
−15 V to 15 V is applied to the second gate;
−10 V to 10 V is applied to the assistant control electrode; and
0 V is applied to the first active layer or the first active layer or grounded.

19. The method of claim 18, wherein the source and the drain are grounded or floated such that charges tunnel into the charge trap layer by a FN tunneling mechanism.

20. The method of claim 17, wherein an electric field is generated between the source and the drain to generate hot electrons such that charges are injected into the charge trap layer by a CHEI mechanism.

* * * * *